United States Patent
Kaneko et al.

(10) Patent No.: US 10,881,014 B2
(45) Date of Patent: Dec. 29, 2020

(54) ELECTRONIC CONTROL DEVICE, AND MANUFACTURING METHOD FOR VEHICLE-MOUNTED ELECTRONIC CONTROL DEVICE

(71) Applicant: Hitachi Automotive Systems, Ltd., Hitachinaka (JP)

(72) Inventors: Yujiro Kaneko, Hitachinaka (JP); Yoshio Kawai, Hitachinaka (JP); Toshiaki Ishii, Tokyo (JP)

(73) Assignee: Hitachi Automotive Systems, Ltd., Hitachinaka (JP)

(*) Notice: Subject to any disclaimer, the term of this patent is extended or adjusted under 35 U.S.C. 154(b) by 146 days.

(21) Appl. No.: 15/759,996

(22) PCT Filed: Aug. 5, 2016

(86) PCT No.: PCT/JP2016/073027
§ 371 (c)(1),
(2) Date: Mar. 14, 2018

(87) PCT Pub. No.: WO2017/056722
PCT Pub. Date: Apr. 6, 2017

(65) Prior Publication Data
US 2018/0255658 A1 Sep. 6, 2018

(30) Foreign Application Priority Data
Sep. 29, 2015 (JP) ................................ 2015-190609

(51) Int. Cl.
*H05K 7/20* (2006.01)
*H05K 5/06* (2006.01)
(Continued)

(52) U.S. Cl.
CPC ............. *H05K 5/065* (2013.01); *B29C 65/70* (2013.01); *B60R 16/02* (2013.01); *H01L 23/29* (2013.01);
(Continued)

(58) Field of Classification Search
CPC ....... G06F 1/181–182; H05K 7/20218–20381; H05K 7/20409–20418;
(Continued)

(56) References Cited

U.S. PATENT DOCUMENTS 6,285,551 B1    9/2001   Brandenburg et al.
7,149,064 B2 *  12/2006  Nolden ................. H02M 5/257
                                                          361/23
(Continued)

FOREIGN PATENT DOCUMENTS

JP    51-76656 U    12/1974
JP    53-126475 U   3/1977
(Continued)

OTHER PUBLICATIONS

Tobitaka. EPO machine Transaltion of JP 2014216326 (Year: 2014).*
(Continued)

*Primary Examiner* — Jacob R Crum
(74) *Attorney, Agent, or Firm* — Crowell & Moring LLP

(57) ABSTRACT

Providing a highly reliable electronic control device capable of achieving both low cost and productivity. An electronic control device including an electronic component, a control substrate on which the electronic component is mounted, and a sealing resin that seals the control substrate, the electronic control device being installed outside the vehicle cabin or in the engine compartment, the electronic control device further including a housing case that fixes the control substrate, and an outer periphery of the housing case being covered with a sealing resin.

19 Claims, 6 Drawing Sheets

(51) Int. Cl.
  *B60R 16/02* (2006.01)
  *H05K 3/28* (2006.01)
  *H05K 5/00* (2006.01)
  *H05K 5/02* (2006.01)
  *H01L 23/29* (2006.01)
  *B29C 65/70* (2006.01)
  *B29L 31/34* (2006.01)

(52) U.S. Cl.
  CPC .............. *H05K 3/28* (2013.01); *H05K 5/00* (2013.01); *H05K 5/0017* (2013.01); *H05K 5/0034* (2013.01); *H05K 5/0082* (2013.01); *H05K 5/02* (2013.01); *H05K 5/0204* (2013.01); *H05K 7/209* (2013.01); *H05K 7/20409* (2013.01); *B29L 2031/3481* (2013.01)

(58) Field of Classification Search
  CPC ....... H05K 7/20009–202; H05K 5/065; H05K 5/00; H05K 5/0017; H05K 5/0082; H05K 5/02; H05K 5/0204; H05K 2201/10522; H05K 9/0049; H05K 3/28; H05K 1/181; H05K 5/0034; H05K 7/209; H01L 23/367–3677; H01L 23/473; H01L 23/46–467; H01L 23/29; B29C 65/70; B60R 16/02; B29L 2031/3481
  USPC ...... 361/676–678, 679.46–679.54, 688–723; 165/80.1–80.5, 104.33, 185; 174/15.1–15.3, 16.1–16.3, 547, 548; 257/712–722, E23.088; 24/453, 458–459; 454/184; 312/236
  See application file for complete search history.

(56) References Cited

U.S. PATENT DOCUMENTS

| | | | | |
|---|---|---|---|---|
| 7,719,833 | B2* | 5/2010 | Inagaki | B60R 16/0239 165/80.3 |
| 8,648,462 | B2* | 2/2014 | Ushijima | H01L 23/427 257/713 |
| 8,693,193 | B2* | 4/2014 | Ishibashi | H02M 7/003 361/688 |
| 2004/0037043 | A1 | 2/2004 | Ku | |
| 2004/0089943 | A1* | 5/2004 | Kirigaya | H01L 23/49811 257/723 |
| 2004/0212965 | A1* | 10/2004 | Ishii | H01L 23/473 361/709 |
| 2005/0190539 | A1* | 9/2005 | Watanabe | H05K 7/20854 361/704 |
| 2006/0171127 | A1* | 8/2006 | Kadoya | H05K 3/284 361/752 |
| 2006/0250756 | A1 | 11/2006 | Sugimoto et al. | |
| 2009/0116197 | A1* | 5/2009 | Funakoshi | H01L 21/4882 361/719 |
| 2009/0135095 | A1* | 5/2009 | Kawada | H01L 23/36 345/60 |
| 2010/0014252 | A1* | 1/2010 | Hamatani | H01G 2/106 361/707 |
| 2010/0072865 | A1* | 3/2010 | Endo | B60K 6/26 310/68 D |
| 2012/0092842 | A1 | 4/2012 | Neumeister et al. | |
| 2012/0138946 | A1* | 6/2012 | Kikuchi | H01L 23/3735 257/76 |
| 2013/0001759 | A1* | 1/2013 | Kim | H01L 23/36 257/675 |
| 2013/0021769 | A1* | 1/2013 | Fukuzono | H01L 23/13 361/783 |
| 2013/0113120 | A1* | 5/2013 | Tsuruoka | H01L 25/072 257/784 |
| 2013/0285232 | A1* | 10/2013 | Ha | H01L 25/16 257/696 |
| 2013/0314877 | A1* | 11/2013 | Watanabe | H01L 23/34 361/719 |
| 2015/0003016 | A1* | 1/2015 | Miyamoto | H01L 23/473 361/701 |
| 2016/0111345 | A1* | 4/2016 | Kawase | H01L 23/36 307/10.1 |
| 2016/0174393 | A1* | 6/2016 | Asao | H05K 7/1432 180/443 |
| 2017/0063071 | A1* | 3/2017 | Yoneyama | H02H 7/222 |
| 2017/0227811 | A1* | 8/2017 | Oda | G02F 1/31 |
| 2017/0301633 | A1* | 10/2017 | Kobayashi | H01L 23/293 |
| 2017/0332482 | A1* | 11/2017 | Hauslmann | G01D 11/245 |
| 2018/0222408 | A1* | 8/2018 | Shigyo | H02G 3/14 |

FOREIGN PATENT DOCUMENTS

| | | |
|---|---|---|
| JP | 2001-358275 A | 12/2001 |
| JP | 2005-93905 A | 4/2005 |
| JP | 2009-173250 A | 8/2009 |
| JP | 2010-56186 A | 3/2010 |
| JP | 2013-258184 A | 12/2013 |
| JP | 2014-108648 A | 6/2014 |
| JP | 2014-216326 A | 11/2014 |

OTHER PUBLICATIONS

International Search Report (PCT/ISA/210) issued in PCT Application No. PCT/JP2016/073027 dated Nov. 1, 2016 with English translation (four pages).

Japanese-language Written Opinion (PCT/ISA237) issued in PCT Application No. PCT/JP2016/073027 dated Nov. 1, 2016 (five pages).

Japanese-language Office Action issued in counterpart Japanese Application No. 2017-542988 dated Jan. 8, 2019 with English translation (five (5) pages).

Extended European Search Report issued in counterpart European Application No. 16850899.2 dated Apr. 11, 2019 (nine (9) pages).

Japanese-language Office Action issued in counterpart Japanese Application No. 2017-542988 dated Jul. 9, 2019 with English translation (six (6) pages).

\* cited by examiner

FIG. 2A
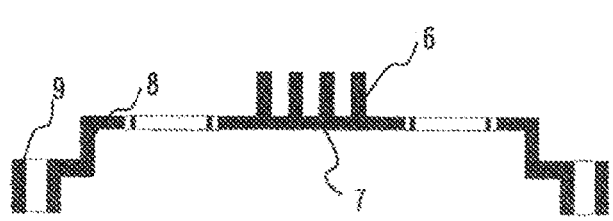
FIG. 2B
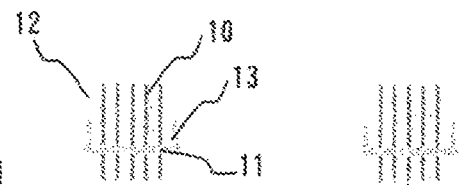
FIG. 2C
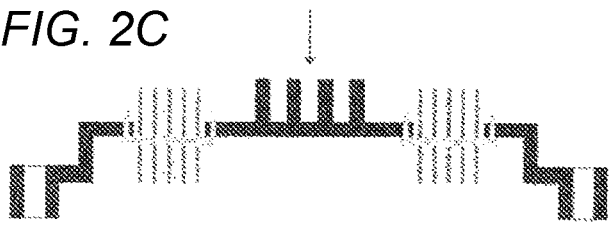
FIG. 2D
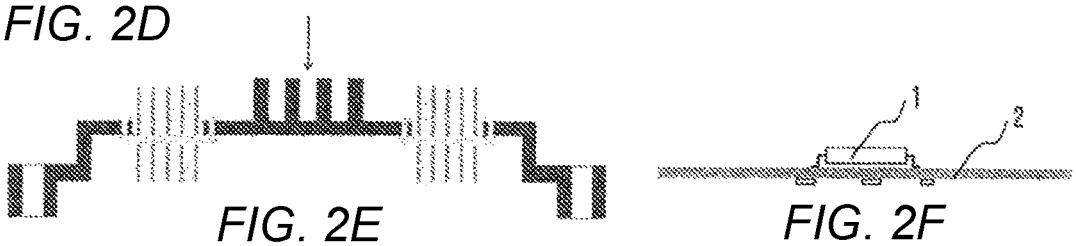
FIG. 2E    FIG. 2F
FIG. 2G
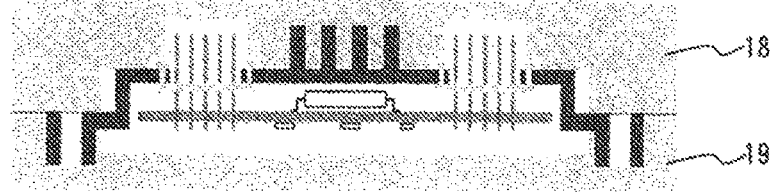
FIG. 2H
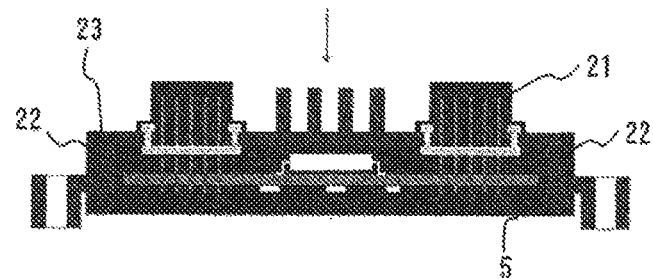

ELECTRONIC CONTROL DEVICE, AND MANUFACTURING METHOD FOR VEHICLE-MOUNTED ELECTRONIC CONTROL DEVICE

TECHNICAL FIELD

The present invention relates to an electronic control device such as an engine control unit and an automatic transmission control unit used for an automobile, and particularly to a casing structure of the electronic control device.

BACKGROUND ART

With the background of environmental and energy problems, the trend of automobile electronics is accelerating, and the number of electronic control devices installed has been greatly increasing. This leads to limitation of installation space for the electronic control devices, and thus, the electronic control devices are inevitably installed in an engine compartment with severe environmental conditions compared with other locations of an automobile. On the other hand, with a trend of an expanded cabin space to achieve enhanced comfortability of an automobile, the engine compartment has been downsized. This necessitates arrangement of a large number of electronic control devices and wire harnesses in a downsized engine compartment, leading to a difficulty in layout, an increase in weight, and increase in cost. This generates a demand for an electronic control device that is smaller, lighter, and lower in cost. In addition, the wire harness tends to be shortened. This results in, for example, installation of the engine control device at a position closer to the engine, leading to a concern about an influence of high heat and high vibration of the engine on the engine control device. To cope with this, there is a need to enhance heat resistance and vibration resistance of the electronic control device. As a countermeasure, there is a known structure in which a control substrate on which electronic components are mounted is sealed with resin (see PTL 1).

An electric-electronic module described in PTL 1 includes an electronic circuit board on which an electronic circuit is mounted and a metal base for mounting the electronic circuit board, in which the electronic circuit board is sealed with a resin, and a resin composition is filled in an outer peripheral portion of a bonding interface between the metal base and the sealing resin. With this configuration, even when the bonding interface between the sealing resin and the metal base peels off, it is possible to suppress contact of the outer peripheral portion of the bonding interface with an external environment, and suppress the contact of the electronic circuit board with the external environment.

CITATION LIST

Patent Literatures

PTL 1: JP 2010-56186 A

SUMMARY OF INVENTION

Technical Problem

Filling the resin composition, however, along the outer peripheral portion of the bonding interface between the metal base and the sealing resin poses a problem of lower production efficiency due to an additional filling step and higher cost due to the use of the resin composition. Moreover, in view of long-term reliability, there is a need to provide a measure to reduce a peeling stress due to a difference in the thermal expansion coefficient between the metal base and the sealing resin at the time of an environmental temperature change, which is one of the main factors of peeling the bonding interface. Furthermore, while water is unlikely to stay by filling the resin composition in a recess formed between the sealing resin and a rising surface, there is a concern about water staying in the outer peripheral portion of the bonding interface depending on the angle at which the product is installed.

This makes it a problem to provide a highly reliable electronic control device capable of simplifying the production process at low cost.

Solution to Problem

An electronic control device including an electronic component, a control substrate on which the electronic component is mounted, and a sealing resin that seals the control substrate, the electronic control device being installed outside the vehicle cabin or in the engine compartment, the electronic control device further including a housing case that fixes the control substrate, and an outer periphery of the housing case being covered with a sealing resin.

Advantageous Effects of Invention

According to the present invention, it is possible to provide a highly reliable electronic control device achieving both low cost and productivity.

BRIEF DESCRIPTION OF DRAWINGS

FIGS. 2A to 2H are configurations and an assembly procedure of an electronic control device of a first embodiment.

DESCRIPTION OF EMBODIMENTS

Hereinafter, a configuration and an assembly procedure of an electronic control device according to specific embodiments of the present invention will be described with reference to the accompanying drawings.

First Embodiment

Figure 1A:
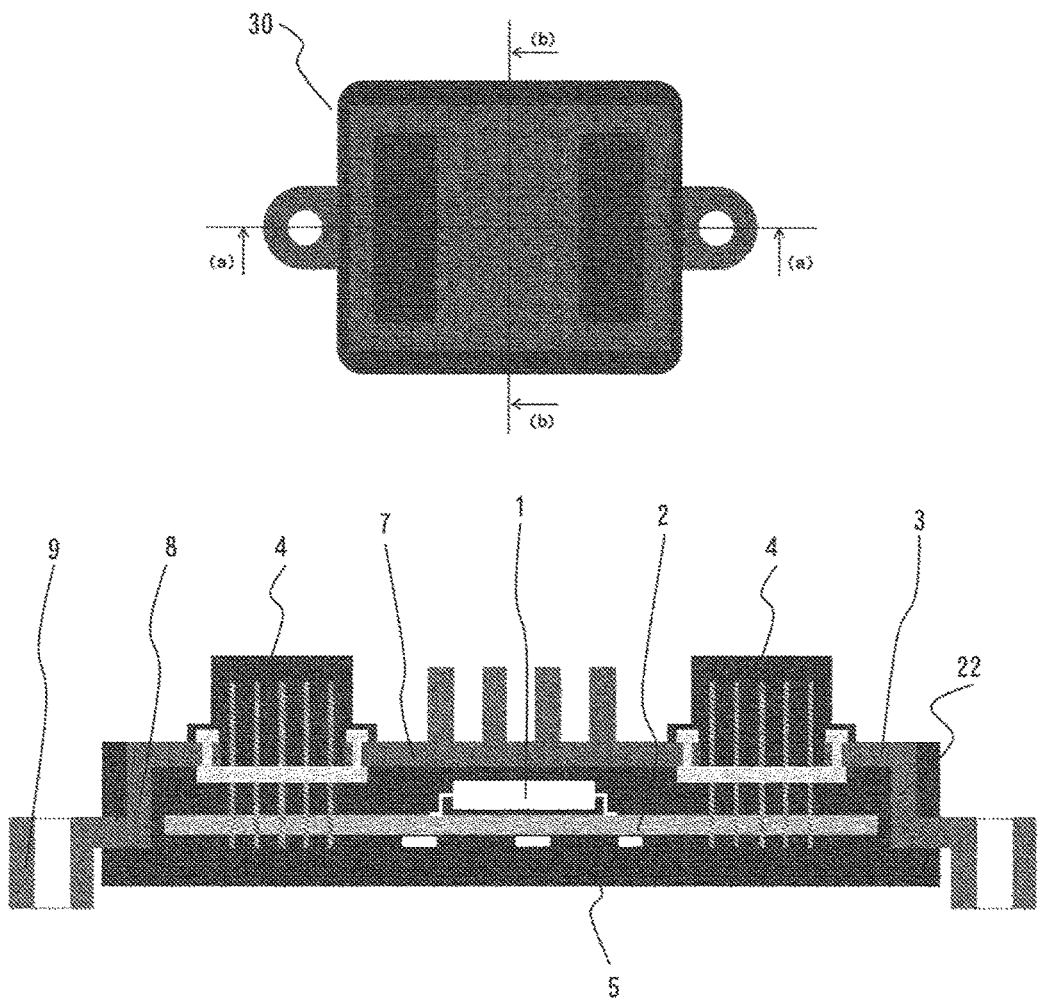
FIGS. 1A and 1B are cross-sectional views of an electronic control device.
Figure 1B:
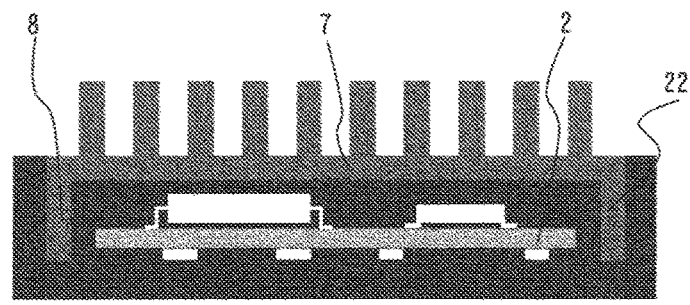

FIG. 1 is a cross-sectional view illustrating an electronic control device 30 according to the first embodiment.

FIG. 2 is a configuration and an assembly procedure of the electronic control device 30 illustrated in FIG. 1.

As illustrated in FIGS. 1 and 2, the electronic control device 30 according to the present invention includes a control substrate 2 on which an electronic component 1 such as a microcomputer is mounted, a housing case 3 as a plate member, a connector 4, and a sealing resin 5.

As illustrated in FIG. 2(*a*), the housing case 3 may be integrally molded together with a heat sink 7 having a heat dissipation fin 6 for dissipating heat generated from electronic components to the outside of the electronic control device 30, an electromagnetic shield unit 8 that shields electromagnetic noise, and a fixture for vehicle mounting 9 for fixing the electronic control device 30 to a vehicle. The material is preferably a metal material having high thermal conductivity, shielding property and rigidity, and it is preferable to use aluminum or an aluminum alloy from the viewpoints of mass productivity, weight reduction, heat dissipation property, and cost. By integrating the heat sink 7, the shield unit 8, and the fixture for vehicle mounting 9 in this manner, it is possible to reduce the number of components, leading to cost reduction and enhancement of productivity.

With the fixture for vehicle mounting 9 integrally molded with the housing case 3, heat dissipated from the electronic component 1 towards the housing case 3 such as the heat sink 7 enables enhanced heat dissipation property to the vehicle body via the fixture for vehicle mounting 9.

In order to enhance a contact property with the sealing resin 5, the surface of the housing case 3 may preferably be roughened or oxidized by anodic oxide coating. This enhances a contact force between the housing case 3 and the sealing resin 5, makes it difficult for the sealing resin 5 to peel off against stress generated by an environmental temperature change, vibration, or the like, leading to enhancement of contact reliability.

As illustrated in FIG. 2(*b*), the connector 4 is formed by fabricating a connector unit assembly 12 constituted with a terminal 10 for connecting a vehicle-side harness with the control substrate 2, and a fixing plate 11 for aligning and holding the terminals 10 at a prescribed pitch. The fixing plate 11 includes pins 13 for increasing insertability into the housing case 3 to be described below and for facilitating positioning. The number of the pins 13 is preferably two or more. The material of the terminal 10 may preferably be copper or a copper alloy from the viewpoint of conductivity, downsizing, and cost. The material of the fixing plate 11 may preferably be a polybutylene terephthalate (PBT) resin, a polyamide (PA) 66 resin, and a polyphenylene sulfide (PPS) resin from the viewpoint of light weight and excellent heat resistance.

Subsequently, as illustrated in FIG. 2(*c*), the housing case 3 and the connector unit assembly 12 are assembled to each other. At that time, the pins 13 of the connector unit assembly 12 are inserted into mutually opposing penetration holes on the housing case 3, and the fixing plate 11 is brought into contact with the housing case 3, thereby positioning the connector unit assembly 12 and the housing case 3.

When the position of the connector unit assembly 12 with respect to the housing case 3 is determined, tips of the pins 13 protruding from the housing case 3 are fixed by thermal caulking as illustrated in FIG. 2(*d*).

After the connector unit assembly 12 is fixed, the control substrate 2 on which the electronic component 1 such as a microcomputer is mounted is assembled to the die casting case 3 as illustrated in FIGS. 2(*e*) and 2(*f*). At that time, an electronic component susceptible to external electromagnetic noise and an electronic component likely to generate electromagnetic noise, such as a microcomputer and a quartz oscillator, are mounted on a surface of the control substrate 2 facing the housing case 3. This configuration enables the electronic component 1 to be surrounded by wiring layers of the housing case 3 and the control substrate 2, leading to enhancement of the electromagnetic shielding property. In order to further enhance the electromagnetic shielding property, it is preferable to provide a solid pattern in one layer of the wiring layers of the control substrate 2 or in the periphery where the electronic component 1 is mounted. This makes it possible to also enhance the shielding property against electromagnetic noise from the surface not facing the housing case 3.

A resin wiring board based on glass epoxy resin or the like is used as the control substrate 2. In connecting the electronic component 1 to the control substrate 2, a lead-free solder such as Sn—Cu solder, Sn—Ag—Cu solder, and Sn—Ag—Cu—Bi solder is applied. By setting the control substrate 2 on a substrate receiving unit (not illustrated) of the housing case 3, the position in a height direction is determined, and subsequently the control substrate 2 is fixed to the housing case 3 using screws (not illustrated). The number of fixation points by screws may preferably be three or more. In connecting the terminal 10 of the connector unit assembly 12 with the control substrate 2, a lead-free solder such as Sn—Cu solder, Sn—Ag—Cu solder, and Sn—Ag—Cu—Bi solder is applied to a through hole portion 17 of the control substrate 2, into which the terminal 10 is inserted, so as to achieve connection. Note that the type of the connector 4 may be a surface mounting type or a press fit type.

What is important here is a method of fixing the connector unit assembly 12. Specifically, in a case where the connector unit assembly 12 is fixed to the control substrate 2 instead of the housing case 3, the positioning pin 13 is to be inserted into the control substrate 2. This would generate a need to provide a penetration hole for the positioning pin 13 on the control substrate 2, and increase the substrate area correspondingly. Moreover, in a case where the terminal 10 of the connector unit assembly 12 and the through hole portion 17 of the control substrate 2 are joined with each other, the connector unit assembly 12 and the control substrate 2 individually expand and contract due to a thermal history by joining. In this process, however, there is a difference in the amount of expansion and contraction between the connector unit assembly 12 and the control substrate 2, leading to generation of warping in the connector unit assembly 12 and the control substrate 2 after joining. Furthermore, due to greater rigidity of the housing case 3 and the flat shape of a substrate receiving surface, fixing the connector unit assembly 12 and the control substrate 2 joined with each other to the housing case 3 would bring the warping of the connector unit assembly 12 and the control substrate 2 with low rigidity back to a former state. This would generate a peeling stress in a joint portion between the terminal 10 and the through hole portion 17.

To cope with this problem, as described in the embodiment, the method of fixing the connector unit assembly 12 may preferably include first fixing the connector unit assembly 12 to the housing case 3, and thereafter joining the terminal 10 of the connector unit assembly 12 to the through hole portion 17 of the control substrate 2. By additionally implementing this method, it is possible to further suppress the warping of the connector unit assembly 12 and the control substrate 2, and also to suppress generation of stress at the joint portion between the terminal 10 and the through hole portion 17.

As illustrated in FIG. 2(*g*), a sub-assembly 20 fabricated in this manner is set in a mold for resin sealing. In the present embodiment, the sub-assembly is set on an upper die 18 that is a movable die, then the upper die is moved and set onto a lower die 19 as a fixed die. The fin portion 6 of the housing cover 3 to be desirably exposed from the resin 5 after resin sealing and the fixture for vehicle mounting 9 have a structure to be held by a mold in order to prevent entry of resin during resin molding.

For the purpose of ensuring the fluidity of the sealing resin 5 and enabling the resin to fill over narrower sites inside of the mold, it is preferable to preheat the mold, the subassembly, and the resin. The sealing resin 5 may be a thermosetting epoxy resin, an unsaturated polyester resin, or a thermoplastic resin. Examples of sealing methods include transfer molding, compression molding, injection molding, and hot melt. Physical property values of the sealing resin 5 are desirably such that the linear expansion coefficient is 10 to $30 \times 10^{-6}/°$ C., and thermal conductivity is 0.5 to 3 W/mK.

After completion of resin filling into the mold, the sealing resin 5 is cured in the mold. After curing, the mold is opened and the resin molded product is taken out to complete fabrication of the electronic control device illustrated in FIG. 2(h).

At that time, the entire surface of an outer periphery 22 of the housing case 3 except the fixture for vehicle mounting 9 is preferably covered with the sealing resin 5 as illustrated in FIG. 1. This configuration increases a contact length from the control substrate 2 to a contact end 23 of the housing case 3 and the sealing resin 5 more than a case where the outer periphery 22 of the housing case 3 is not covered with the sealing resin 5, making it possible to enhance waterproof and anti-saline reliability. Furthermore, the structure in which the outer periphery 22 is covered with the sealing resin 5 has an effect of being capable of suppressing deformation of the housing case 3 against vibration and heat influence by the sealing resin 5, leading to enhancement of waterproof and anti-saline reliability even in an environment having vibration and heat influence. In addition, suppressing the deformation of the housing case 3 against the vibration and the thermal influence by the sealing resin 5 makes it possible to reduce the distortion given by the deformation of the housing case 3 to a solder connecting portion joining the control substrate 2 and the electronic component 1, leading to enhancement of solder connection reliability.

Note that the fixture for vehicle mounting 9 may also be covered with the sealing resin 5. This eliminates the contact end of the housing case 3 and the sealing resin 5, and thus, enhances contact reliability.

Moreover, the surface of the housing case 3 and the surface of the sealing resin 5 may preferably be on a same surface at the contact end 23 of the housing case 3 and the sealing resin 5. This makes it possible to suppress accumulation of water, salt water, and foreign matter at the contact end 23.

In addition, it is further preferable to cover the thermal caulking portion of the connector terminal fixing plate 11 with the sealing resin 5. This makes it possible to suppress deterioration of the thermal caulking portion and suppress entry of water and salt water from the thermal caulking portion.

Finally, a housing 21 of the connector 4 is also integrally molded with the sealing resin 5. This can omit necessity to provide the connector housing as a separate component, leading to reduction of the number of components, and probably leading to a cost advantage and productivity enhancement.

Second Embodiment

Figure 3:
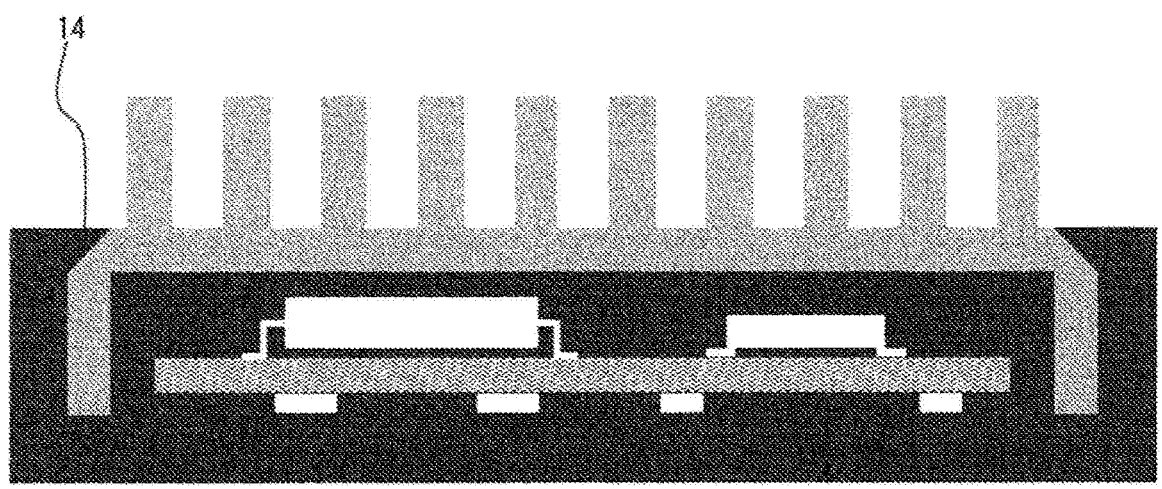
FIG. 3 is an enlarged cross-sectional view of a thermal caulking portion of a second embodiment.

The configuration of a second embodiment will be described in comparison with the first embodiment. While the first embodiment is a case where a rising portion of the outer periphery of the housing case 3 rises vertically, the second embodiment provides a form including an inclined portion 14 as illustrated in FIG. 3. This increases a bonding area with the sealing resin 5 as compared with the case of rising vertically, leading to enhancement of contact reliability.

Third Embodiment

Figure 4:
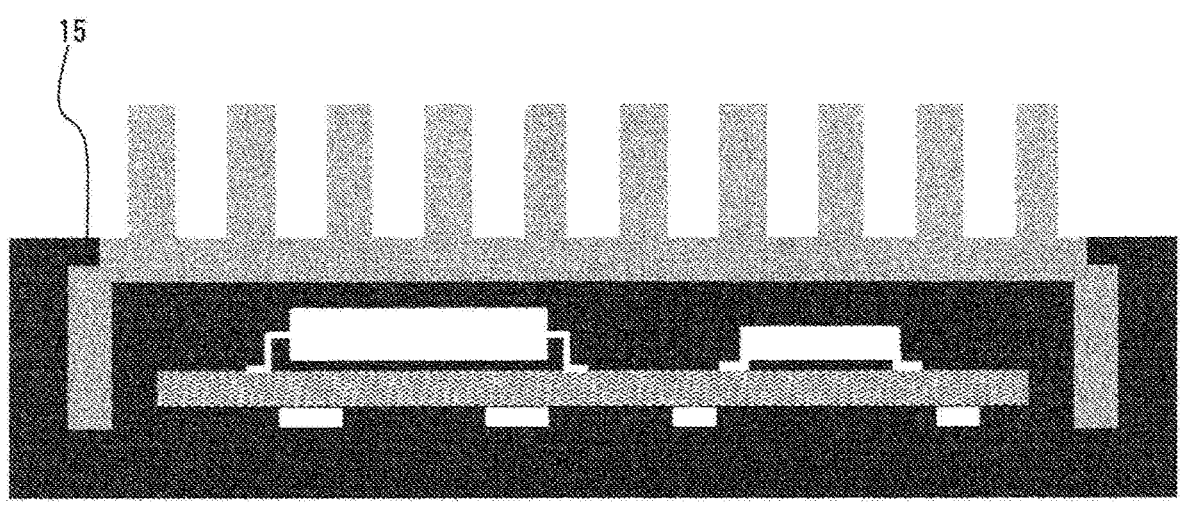
FIG. 4 is a configuration of an electronic control device of a third embodiment.

The configuration of a third embodiment will be described in comparison with the first embodiment. While the first embodiment is a case where a rising portion of the outer periphery of the housing case 3 rises vertically, the third embodiment provide a form including a recess 15 as illustrated in FIG. 4. This increases a bonding area with the sealing resin 5 as compared with the case of rising vertically and having the inclined portion, leading to enhancement of contact reliability.

Fourth Embodiment

The configuration of a fourth embodiment will be described in comparison with the first embodiment. While the first embodiment has a structure in which the heat dissipation fin portion 6 of the housing case 3 is exposed from the sealing resin 5, the fourth embodiment will give description of a configuration and an assembling procedure of the electronic control device 30 in a case where the heat dissipation fin portion 6 of the housing case 3 is covered by the sealing resin 5 with reference to FIG. 5.

Figure 5A:
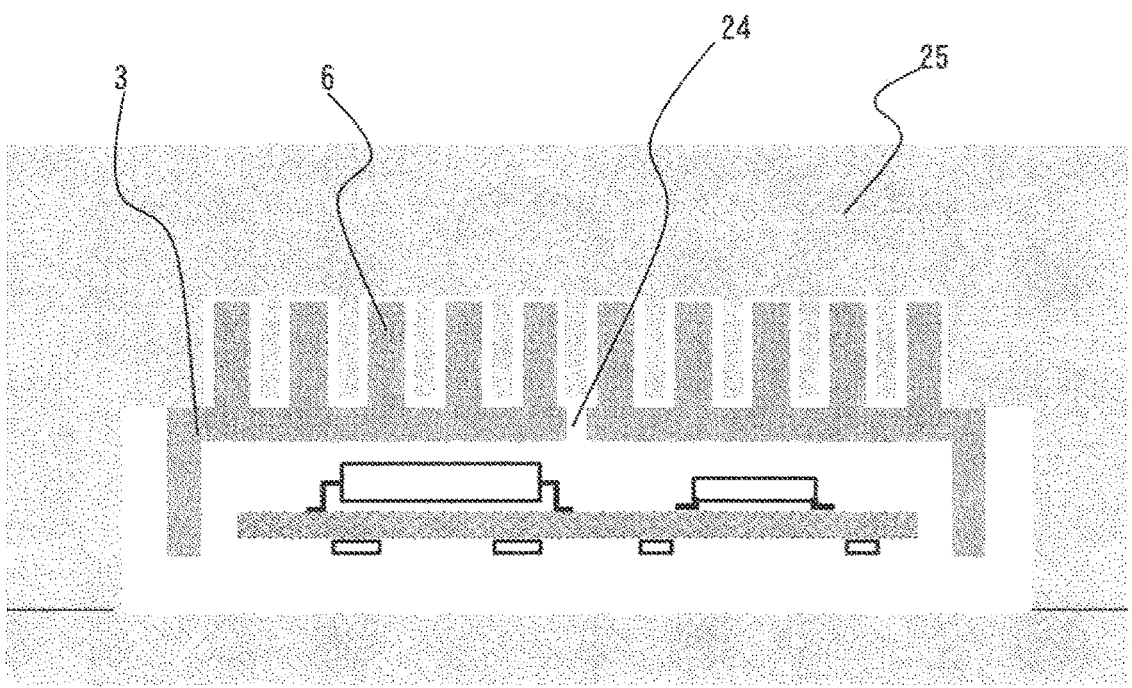
FIGS. 5A and 5B are configurations and an assembly procedure of an electronic control device of a fourth embodiment.
Figure 5B:
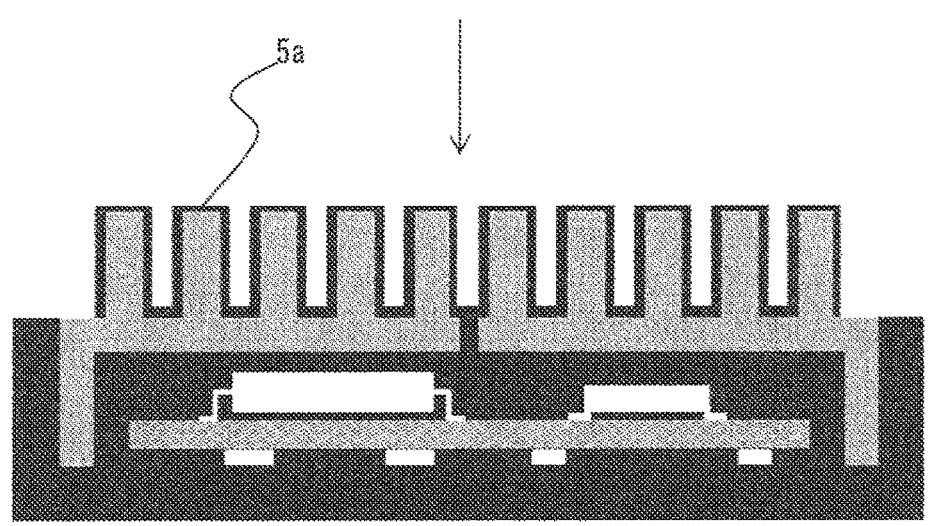

As illustrated in FIG. 5(a), the width or the depth for engraving a mold 25 in the heat dissipation fin 6 portion is increased to be larger than the heat dissipation fin 6 so as to form a space between the heat dissipation fin and the mold. In addition, a penetration hole 24 is provided between the heat dissipation fins 6 of the housing case 3. A plurality of the penetration holes 24 may be provided. This configuration makes it possible to supply the sealing resin 5 to the heat dissipation fin portion 6 through the penetration hole 24 at the time of resin molding as illustrated in FIG. 5(b). A sealing resin 5a covering the heat dissipation fin 6 preferably has a thickness of several tens of μm. This would enhance the heat radiation rate and thus, probably enhance the heat dissipation property.

Fifth Embodiment

The configuration of a fifth embodiment will be described in comparison with the second embodiment. While the fifth embodiment has a structure in which the heat dissipation fin portion 6 of the housing case 3 is covered with the sealing resin 5, the third embodiment will give a description of a configuration and an assembly procedure of the electronic control device 30 in a case where the sealing resin 5a that covers the heat dissipation fin 6 of the housing case 3 and a sealing resin 5b that covers the rising portion on the outer periphery of the housing case are integrated, with reference to FIG. 6.

Figure 6A:
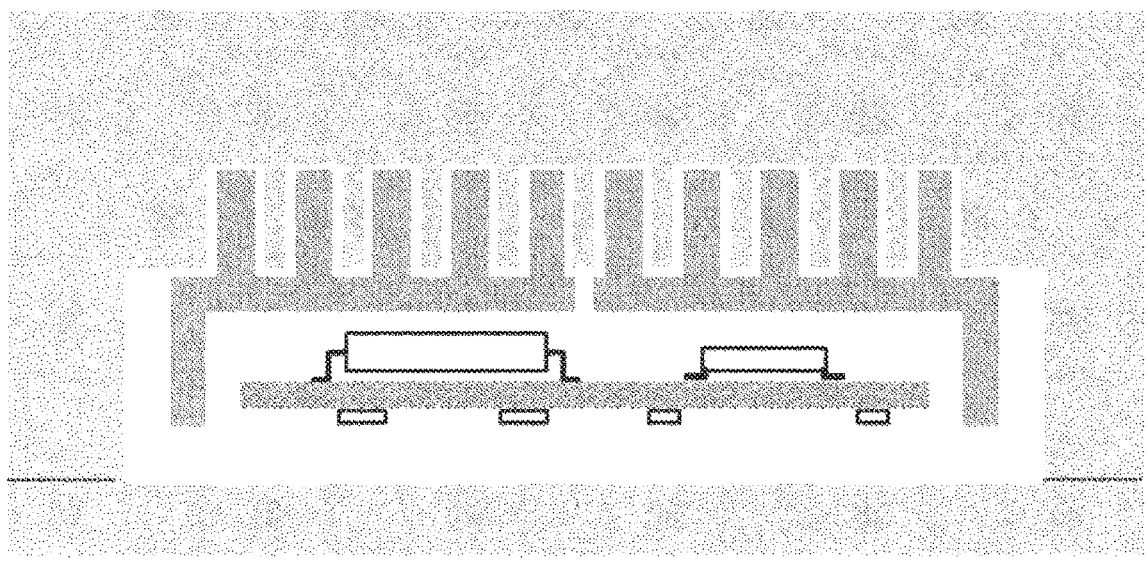
FIGS. 6A and 6B are configurations and an assembly procedure of an electronic control device of a fifth embodiment.
Figure 6B:
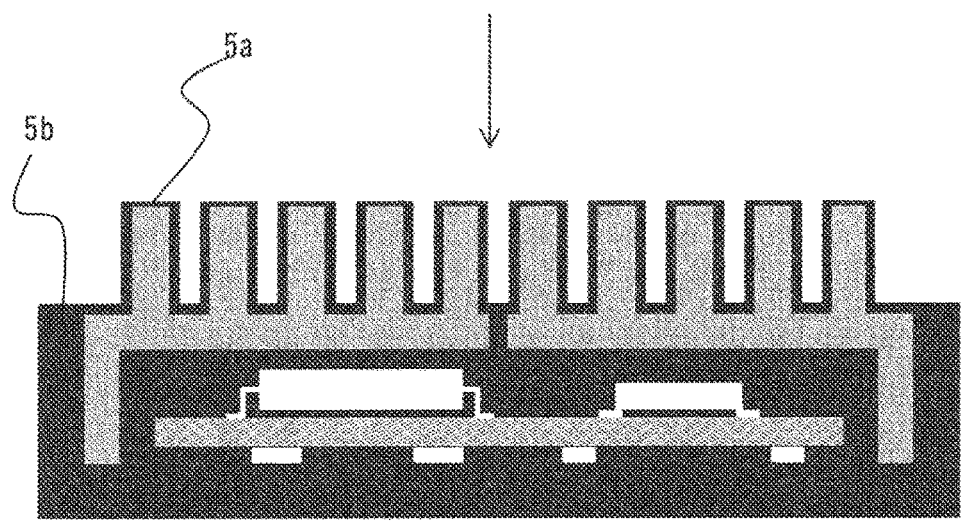

As illustrated in FIG. 6(a), it is configured such that a region surrounded by the end portion of the heat dissipation fin 6 and the rising portion of the outer periphery of the housing case includes a clearance (gap) without being pressed by the mold 25. This causes the sealing resin 5 to be also supplied from the outer periphery of the housing case toward the heat dissipation fin 6 at the time of resin molding, enhancing resin filling property as compared with the second embodiment. Furthermore, as illustrated in FIG. 6(b), by integrating the sealing resin 5a that covers the heat dissipation fin 6 of the housing case 3 and the sealing resin 5b that covers the rising portion of the outer periphery of the housing case, the contact end of the housing case 3 and the sealing resin 5 is eliminated, leading to enhancement of the contact reliability.

As above, embodiments of the control device according to the present invention have been described. The present invention is not limited to the above-described embodiments but may include various design modifications without departing from the spirit according to the present invention described in claims.

REFERENCE SIGNS LIST 1 electronic component
2 control substrate
3 housing case
4 connector
5 sealing resin
5a sealing resin to cover heat dissipation fin
5b sealing resin to cover rising portion of outer periphery of housing case
6 heat dissipation fin
7 heat sink
8 electromagnetic shield unit
9 fixture for vehicle mounting
10 terminal
11 fixing plate
12 connector unit assembly
13 pin
14 slope
15 recess
17 through hole portion
18 upper mold
19 lower mold
20 sub-assembly
21 connector housing
22 outer periphery of housing case
23 contact end of housing case and sealing resin
24 penetration hole
25 mold
30 electronic control device

The invention claimed is:

1. An electronic control device comprising:
an electronic component;
a connector housing;
a control substrate on which the electronic component is mounted; and
a sealing resin that seals the control substrate,
the electronic control device being installed outside a vehicle cabin or in an engine compartment,
the electronic control device further including a plate member facing the control substrate, and
at least a portion of an outer periphery of the plate member being covered with the sealing resin, wherein the control substrate is fixed to the plate member,
the plate member includes a rising portion on an outer periphery,
the rising portion is peripherally sealed with the sealing resin,
an outer periphery of the rising portion is covered with the sealing resin,
the plate member has a concave shape, so as to contain the electronic) component inside the plate member, the bottom of the concave shape has penetration holes, and
the connector housing and the sealing resin are integrally molded together.

2. The electronic control device according to claim 1, wherein the plate member has a recessed shape, and the control substrate is housed in the plate member.

3. The electronic control device according to claim 2, wherein a surface of the plate member and a surface of the sealing resin are on a same surface at an end of a contact surface between the plate member and the sealing resin.

4. The electronic control device according to claim 1, wherein the plate member includes a fixture for vehicle body mounting provided for attaching the electronic control device to a vehicle body, and
the sealing resin covers the outer periphery of the plate member except for the fixture for vehicle body mounting.

5. The electronic control device according to claim 1, wherein the plate member includes a heat dissipation fin, and
the heat dissipation fin is covered with the sealing resin.

6. The electronic control device according to claim 5, wherein the sealing resin covering the heat dissipation fin is connected with the sealing resin on the outer periphery of the plate member.

7. The electronic control device according to claim 5, wherein the plate member includes a penetration hole, and
the sealing resin covering the heat dissipation fin is connected via the penetration hole with a sealing resin filling a portion between the plate member and the control substrate.

8. The electronic control device according to claim 1, wherein a surface of a portion of the plate member coming in close contact with the sealing resin is roughened or oxidized.

9. The electronic control device according to claim 1, wherein the plate member is formed of one of aluminum and an aluminum alloy.

10. The electronic control device according to claim 1, wherein the sealing resin is a thermosetting resin.

11. The electronic control device according to claim 1, wherein a linear expansion coefficient of the sealing resin is 10 to $30 \times 10^{-6}$/° C.

12. The electronic control device according to claim 1, wherein thermal conductivity of the sealing resin is 0.5 to 3 W/mK.

13. A method for manufacturing a vehicle-mounted electronic control device, the method comprising:
a setting step of fixing a plate member including a heat dissipation fin and a penetration hole to a mold so as to provide a space between the heat dissipation fin and the mold; and
a sealing step of sealing, with resin, the plate member and the control substrate fixed in a state of facing the plate member,
wherein the sealing step covers at least a portion of an outer periphery of the plate member with the resin, and fills the resin between the plate member and a control substrate into a portion between the heat dissipation fin and the mold via the penetration hole, wherein
the plate member includes a rising portion on an outer periphery,
the rising portion is peripherally sealed with the sealing resin, and an outer periphery of the rising portion is covered with the sealing resin.

14. A method for manufacturing a vehicle-mounted electronic control device, the method comprising:
   a setting step of fixing a plate member including a heat dissipation fin and a penetration hole to a mold so as to provide a gap between the heat dissipation fin and the mold; and
   a sealing step of sealing, with resin, the plate member and a control substrate fixed in a state of facing the plate member, wherein
      the sealing step covers at least a portion of an outer periphery of the plate member with the resin, and fills the resin into a portion between the heat dissipation fin and the mold via the gap,
      the plate member includes a rising portion on an outer periphery,
      the rising portion is peripherally sealed with the sealing resin, and
      an outer periphery of the rising portion is covered with the sealing resin.

15. The electronic control device according to claim 2,
   wherein the plate member includes a fixture for vehicle body mounting provided for attaching the electronic control device to a vehicle body, and
   the sealing resin covers the outer periphery of the plate member except for the fixture for vehicle body mounting.

16. The electronic control device according to claim 3,
   wherein the plate member includes a fixture for vehicle body mounting provided for attaching the electronic control device to a vehicle body, and
   the sealing resin covers the outer periphery of the plate member except for the fixture for vehicle body mounting.

17. The electronic control device according to claim 2,
   wherein the plate member includes a heat dissipation fin, and
   the heat dissipation fin is covered with the sealing resin.

18. The electronic control device according to claim 3,
   wherein the plate member includes a heat dissipation fin, and
   the heat dissipation fin is covered with the sealing resin.

19. The electronic control device according to claim 4,
   wherein the plate member includes a heat dissipation fin, and
   the heat dissipation fin is covered with the sealing resin.

* * * * *